United States Patent
Park et al.

(10) Patent No.: US 9,691,982 B2
(45) Date of Patent: Jun. 27, 2017

(54) METHOD OF MANUFACTURING THIN FILM TRANSISTOR

(71) Applicant: Samsung Display Co., Ltd., Yongin, Gyeonggi-Do (KR)

(72) Inventors: Sang-Jin Park, Yongin (KR); Myung-Ho Kim, Yongin (KR); Jun-Hwan Moon, Yongin (KR); Keun-Chang Lee, Yongin (KR); Yoon-Jong Cho, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 59 days.

(21) Appl. No.: 14/567,980

(22) Filed: Dec. 11, 2014

(65) Prior Publication Data

US 2016/0013222 A1 Jan. 14, 2016

(30) Foreign Application Priority Data

Jul. 14, 2014 (KR) ........................ 10-2014-0088448

(51) Int. Cl.
*H01L 51/00* (2006.01)
*H01L 29/49* (2006.01)
*H01L 29/66* (2006.01)
*H01L 27/32* (2006.01)

(52) U.S. Cl.
CPC ...... *H01L 51/0027* (2013.01); *H01L 29/4908* (2013.01); *H01L 29/66757* (2013.01); *H01L 27/3248* (2013.01); *H01L 2227/323* (2013.01)

(58) Field of Classification Search
CPC .......... H01L 51/0027; H01L 29/66757; H01L 29/4908
See application file for complete search history.

(56) References Cited

U.S. PATENT DOCUMENTS 5,827,760 A * 10/1998 Seo .................... H01L 29/66765
257/E21.414
5,851,860 A * 12/1998 Makita ................ H01L 27/1277
257/E27.112
5,937,304 A * 8/1999 Yoshinouchi ....... H01L 21/2236
257/E21.143

(Continued)

FOREIGN PATENT DOCUMENTS

JP 09-102612 A 4/1997
KR 10-1999-0020386 A 3/1999

(Continued)

OTHER PUBLICATIONS

Fonash, Stephen, "Doping in a solar cell," graphic from *Solar Cell Device Physics*, Copyright © 2010 Elsevier Inc., p. 133.

(Continued)

*Primary Examiner* — Michael Jung
*Assistant Examiner* — Mikka Liu
(74) *Attorney, Agent, or Firm* — Knobbe Martens Olson & Bear LLP

(57) ABSTRACT

A method of manufacturing a thin film transistor is disclosed. In one aspect, the method includes forming an active layer over a substrate and forming a gate insulating layer containing a dopant over the active layer. The method also includes irradiating laser light onto the gate insulating layer such that the dopant of the gate insulating layer diffuses into the active layer.

18 Claims, 11 Drawing Sheets

(56) References Cited

U.S. PATENT DOCUMENTS

| | | | |
|---|---|---|---|
| 6,252,248 B1* | 6/2001 | Sano | G02F 1/136227 |
| | | | 257/350 |
| 2003/0155860 A1* | 8/2003 | Choi | H01L 51/5284 |
| | | | 313/498 |
| 2004/0004220 A1* | 1/2004 | Suzuki | H01L 29/42384 |
| | | | 257/66 |
| 2004/0229411 A1* | 11/2004 | Battersby | H01L 29/66757 |
| | | | 438/151 |
| 2005/0142707 A1 | 6/2005 | Kim et al. | |
| 2006/0145158 A1* | 7/2006 | Noguchi | H01L 29/4908 |
| | | | 257/66 |
| 2014/0094002 A1 | 4/2014 | Ma | |

FOREIGN PATENT DOCUMENTS

| | | |
|---|---|---|
| KR | 10-2001-0093264 A | 10/2001 |
| KR | 10-2005-0064567 A | 6/2005 |

OTHER PUBLICATIONS

Plummer et al., "CMOS (NMOS, PMOS) schematic," schematic from *Silicon VLSI Technology: Fundamentals, Practice, and Modeling*, Jul. 24, 2000.

* cited by examiner

METHOD OF MANUFACTURING THIN FILM TRANSISTOR

CROSS-REFERENCE TO RELATED APPLICATIONS

This application claims the benefit of Korean Patent Application No. 10-2014-0088448, filed on Jul. 14, 2014, in the Korean Intellectual Property Office, the disclosure of which is incorporated herein in its entirety by reference.

BACKGROUND

Field

The described technology generally relates to a method of manufacturing a thin film transistor.

Description of the Related Technology

Flat panel displays such as organic light-emitting diode (OLED) displays and liquid crystal displays include thin film transistors each having an active layer. The active layer becomes crystallized through an appropriate heat treatment process after being formed on a substrate in an amorphous state first and goes through a doping process of implanting a dopant to improve an electrical property.

SUMMARY OF CERTAIN INVENTIVE ASPECTS

One inventive aspect is a method of manufacturing a thin film transistor.

Another aspect is a method of manufacturing a thin film transistor with an improved doping process of an active layer.

Another aspect is a method of manufacturing a thin film transistor which includes forming an active layer on a substrate, forming a gate insulating layer containing a dopant on the active layer, and irradiating laser so that the dopant of the gate insulating layer diffuses into the active layer.

Forming the active layer on the substrate may include forming the active layer in an amorphous state on the substrate, and crystallizing the active layer from the amorphous state into a crystalline state.

Forming the active layer on the substrate may include forming the active layer in an amorphous state on the substrate, and irradiating the laser may include crystallizing the active layer from the amorphous state into a crystalline state by irradiating the laser.

Forming the gate insulating layer may include further forming an auxiliary insulating layer containing no dopant in a layer adjoining the gate insulating layer.

The method may further include forming a gate electrode facing a channel portion in a center of the active layer on the gate insulating layer and additionally doping a dopant into contact portions on both end sides of the channel portion while using the gate electrode as a mask.

Additionally doping the dopant may include ion implanting the dopant in the contact portions.

The method may further include activating the additionally doped dopant by irradiating laser with respect to the contact portions.

Additionally doping the dopant may include making the dopant of the gate insulating layer get doped by diffusion into the contact portions by irradiating laser with respect to the contact portions.

The method may further include forming an interlayer insulating film on the gate electrode and forming a source electrode and a drain electrode connected to the contact portions on the interlayer insulating film. The active layer may include a channel portion in a center of the active layer and contact portions on both end sides of the channel portion, and the dopant of the gate insulating layer uniformly diffuses into the channel portion and the contact portions in irradiating of the laser.

Another aspect is a method of manufacturing a thin film transistor, the method comprising: forming an active layer over a substrate; forming a gate insulating layer containing a dopant over the active layer; and irradiating laser light onto the gate insulating layer such that the dopant of the gate insulating layer diffuses into the active layer.

In the above method, the forming of the active layer comprises: forming the active layer in an amorphous state over the substrate; and crystallizing the active layer from the amorphous state into a crystalline state. In the above method, the dopant is substantially uniformly diffused into substantially the entire region of the active layer. In the above method, the forming of the active layer comprises forming the active layer in an amorphous state over the substrate, and wherein the irradiating comprises crystallizing the active layer from the amorphous state into a crystalline state by the irradiating. In the above method, the forming of the gate insulating layer comprises forming an auxiliary insulating layer containing no dopant in a layer adjoining the gate insulating layer. The above method further comprises: forming a gate electrode facing a channel portion in a center of the active layer over the gate insulating layer; and additionally doping a dopant into contact portions on both end sides of the channel portion while using the gate electrode as a mask. In the above method, the additionally doping comprises ion implanting the dopant in the contact portions.

The above method further comprises activating the additionally doped dopant by irradiating laser light with respect to the contact portions. In the above method, the additionally doping comprises irradiating laser light onto the contact portions such that the dopant of the gate insulating layer is doped by diffusion into the contact portions. The above method further comprises: forming an interlayer insulating film over the gate electrode; and forming a source electrode and a drain electrode connected to the contact portions on the interlayer insulating film. In the above method, the active layer comprises a channel portion in a center of the active layer and contact portions on both end sides of the channel portion, and wherein the dopant of the gate insulating layer substantially uniformly diffuses into the channel portion and the contact portions by the irradiating.

Another aspect is a method of manufacturing a display device, the method comprising: forming a thin film transistor over a substrate; and forming a pixel electrode to be electrically connected to the thin film transistor, wherein the forming of the thin film transistor comprises: forming an active layer over the substrate; forming a gate insulating layer containing a dopant over the active layer; and irradiating laser light onto the gate insulating layer such that the dopant of the gate insulating layer diffuses into the active layer.

The above method further comprises forming an organic light-emitting layer on the pixel electrode. In the above method, the organic light-emitting layer does not overlap the active layer. In the above method, the forming of the active layer comprises: forming the active layer in an amorphous state over the substrate; and crystallizing the active layer from the amorphous state into a crystalline state. In the above method, the dopant is substantially uniformly diffused into substantially the entire region of the active layer. In the above method, the forming of the active layer comprises forming the active layer in an amorphous state over the substrate, and wherein the irradiating comprises crystallizing the active layer from the amorphous state into a crystalline state by the irradiating.

In the above method, the forming of the gate insulating layer comprises forming an auxiliary insulating layer containing no dopant in a layer adjoining the gate insulating layer. The above method further comprises: forming a gate electrode facing a channel portion in a center of the active layer over the gate insulating layer; and additionally doping a dopant into contact portions on both end sides of the channel portion while using the gate electrode as a mask. In the above method, the additionally doping comprises irradiating laser light onto the contact portions such that the dopant of the gate insulating layer is doped by diffusion into the contact portions.

DETAILED DESCRIPTION OF CERTAIN INVENTIVE EMBODIMENTS

Figure 1:
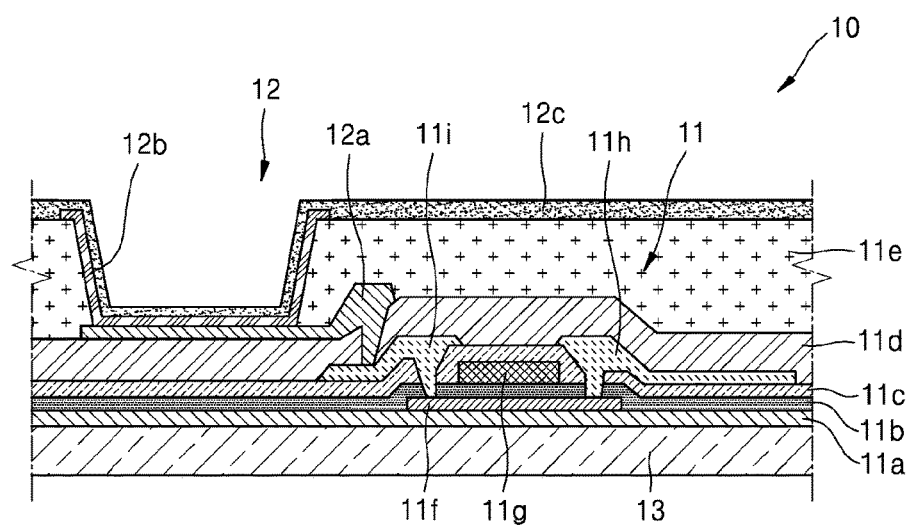
FIG. 1 is a cross-sectional view illustrating a structure of an OLED including a thin film transistor.

Reference will now be made in detail to embodiments, examples of which are illustrated in the accompanying drawings, wherein like reference numerals refer to like elements throughout, and thus their repeated description will be omitted.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When an embodiment may be implemented differently, a process order may be performed differently from the described order. For example, two consecutively described processes may be performed substantially at the same time or performed in an order opposite to the described order.

In this disclosure, the term "substantially" includes the meanings of completely, almost completely or to any significant degree under some applications and in accordance with those skilled in the art. Moreover, "formed on" can also mean "formed over." The term "connected" includes an electrical connection.

FIG. 1 is a sectional view outlining a portion of an OLED display 10 including a thin film transistor.

As illustrated, the OLED display 10 has the thin film transistor 11 and an electroluminescence (EL) device 12.

First, the EL device 12 embodying an image as being driven by the thin film transistor 11, thereby emitting light, has a pixel electrode 12a and a counter electrode 12c facing each other, and an organic emission layer 12b, which is a light emitting layer interposed between the pixel electrode 12a and the counter electrode 12c.

When a constant voltage is being applied to the counter electrode 12c, a voltage is selectively applied to the pixel electrode 12a connected to the thin film transistor 11 by the thin film transistor 11. Accordingly, when a proper voltage is formed between the two electrodes 12a and 12c by the selective voltage applying of the thin film transistor 11, the organic emission layer 12b between the two electrodes 12a and 12c comes to embody an image while emitting light.

Also, the thin film transistor 11 includes a structure where an active layer 11f, a gate electrode 11g, a source electrode 11h and a drain electrode 11i, and the like are stacked up on a substrate 13 in order. Accordingly, when an electrical signal is applied to the gate electrode 11g, electricity is conducted from the source electrode 11h to the drain electrode 11i through the active layer 11f, and thus a voltage is applied to the pixel electrode 12a connected with the drain electrode 11i, thereby inducing the organic emission layer 12b to emit light as described above.

A reference numeral 11a denotes a buffer layer interposed between the substrate 13 and the active layer 11f, a reference numeral 11b a gate insulating layer, a reference numeral 11c an interlayer insulating film, a reference numeral 11d a passivation film, and a reference numeral 11e a planarization film.

For reference, a hole injection layer (HIL), a hole transport layer (HTL), an electron transport layer (ETL), an electron injection layer (EIL), and the like may be further stacked up adjacent to the organic emission layer 12b of the EL device 12. Also, the organic emission layer 12b may be formed with each pixel being separated so that pixels emitting lights of red, green, and blue gather to form one unit pixel. Also, regardless of location of the pixels, the organic emission layer 12b may be commonly formed all over the whole pixel region. Here, the organic emission layer 12b, for example, may be formed with layers including luminescent materials emitting lights of red, green, and blue stacked up vertically or mixed up. It is possible to combine other colors if a white light may be emitted. Also, a color conversion layer converting the emitted white light into a predetermined color or a color filter may be further included. Also, a thin film encapsulation layer (not shown) in which organic films and inorganic films are alternately stacked up may be formed on the counter electrode 12c.

Meanwhile, forming the active layer 11f goes through a process of forming an amorphous silicon layer on the buffer layer 11a on the substrate 13 and then changing the amorphous silicon layer into a crystalline silicon layer by crystallization through heat treatment, and a doping process of implanting a dopant to improve an electrical property of the active layer 11f.

Hereinafter, a process of manufacturing the thin film transistor 11 including a process of forming such an active layer 11f and the OLED 10 will be described with reference to FIGS. 2A through 2H.

Figure 2A:
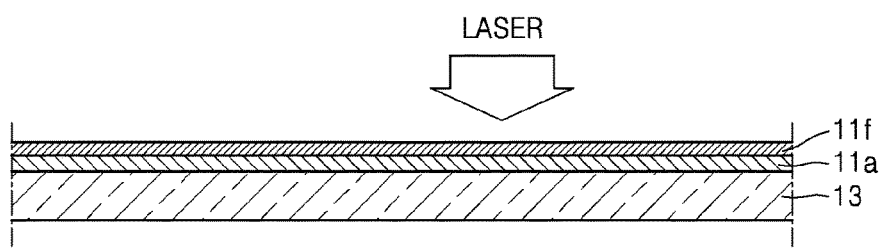
FIGS. 2A through 2H are cross-sectional views sequentially illustrating a manufacturing process of the thin film transistor according to an embodiment.

First, the buffer layer 11a is formed on the substrate 13 and the silicon active layer 11f is deposited on the buffer layer 11a as shown in FIG. 2A. Here, the deposited active layer 11f is still in an amorphous state, on which laser is irradiated as in FIG. 2A in order to make the active layer 11f into a crystalline state. As the active layer 11f in the amorphous state becomes heated up to a crystallization temperature or higher, crystallization makes progress. Excimer laser may be used as the laser described above.

Figure 2B:
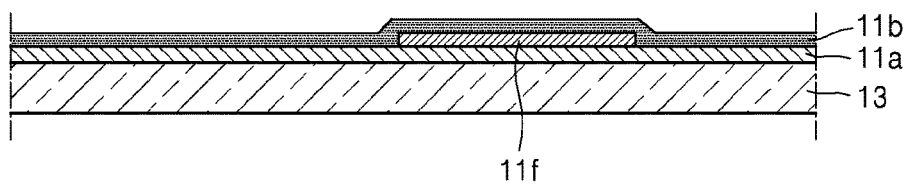

Next, as shown in FIG. 2B, the crystallized active layer 11f is patterned and the SiOx gate insulating layer 11b is deposited thereon, in which the dopant is included in the gate insulating layer 11b by supplying a dopant gas as well. For example, by supplying $B_2H_6$ gas in the case that boron (B) is intended to be used as the dopant and by supplying $PH_3$ gas in the case that phosphorus (P) is intended to be used as the dopant as well when the gate insulating layer 11b is deposited, the dopant such as B or P is included in the gate insulating layer 11b.

Figure 2C:
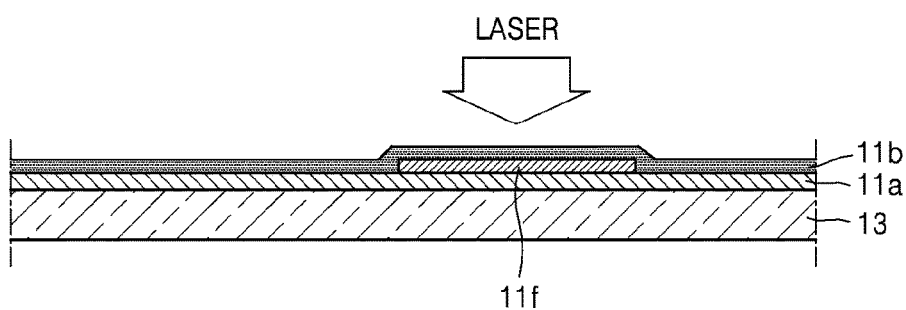

After the gate insulating layer 11b including the dopant has been formed as such, the doping is made to take place as the dopant included in the gate insulating layer 11b is diffused into the active layer 11f by irradiating laser as in FIG. 2C. Then, as the dopant included in the gate insulating layer 11b is diffused into the active layer 11f, the doping takes place substantially uniformly in the whole region of the active layer 11f. The completed active layer 11f, as shown in FIG. 2F, comes to have a central channel portion 11f-1 facing the gate electrode 11g and contact portions 11f-2 on both end sides of the channel portion 11f-1 connected to the source electrode 11h and the drain electrode 11i. Here, the doping takes place substantially uniformly both in the channel portion 11f-1 and in the contact portions 11f-2. Also, because the doping takes place as the active layer 11f is heated by the laser irradiation, annealing treatment for activating the dopant makes progress as well along with the doping. Here, because a switch function of the thin film transistor 11 may not work properly if a large amount of the dopant is doped to the extent that the channel portion 11f-1 of the active layer 11f will become conductive, the amount of the dopant to be doped here is small to such an extent as to improve a threshold voltage property of the channel portion 11f-1. In some embodiments, in order for the contact portions 11f-2 connected to the source electrode 11h and the drain electrode 11i to become conductive, additional doping in the contact portions 11f-2 makes progress in a subsequent process.

Figure 2D:
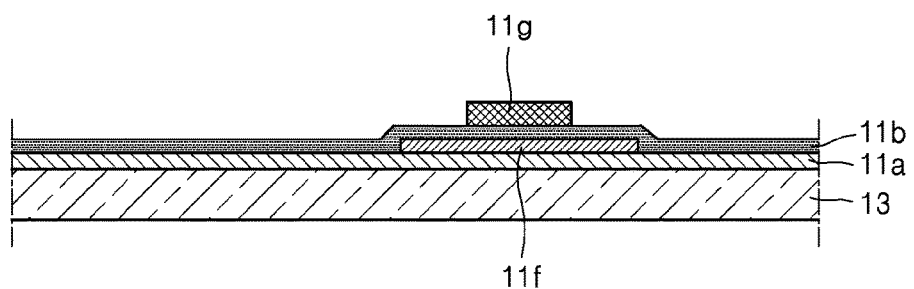

After the dopant doping by diffusion from the gate insulating layer 11b to the active layer 11f has been completed, the gate electrode 11g is formed as in FIG. 2D.

Figure 2E:
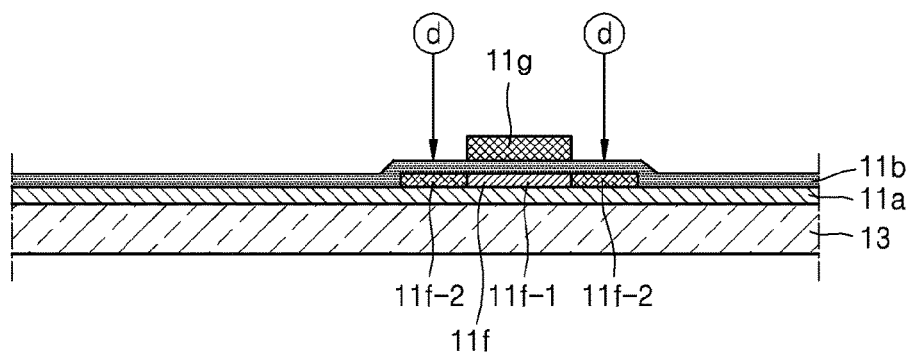
Figure 2F:
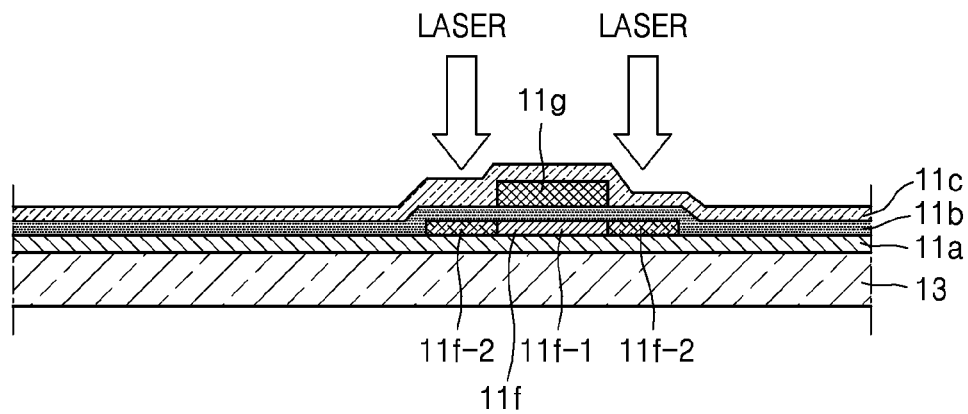

Next, as described above, the dopant is ion implanted in the contact portions 11f-2 of the active layer 11f as in FIG. 2E. Here, the gate electrode 11g facing the channel portion 11f-1 works as a mask preventing the dopant from being doped into the channel portion 11f-1.

Next, as shown in FIG. 2F, after the interlayer insulating film 11c has been formed, the dopant additionally doped into the contact portions 11f-2 is electrically activated by irradiating laser for annealing. Then the active layer 11f including the channel portion 11f-1 which has an improved threshold voltage property and the contact portions 11f-2 which have become conductive is obtained.

Figure 2G:
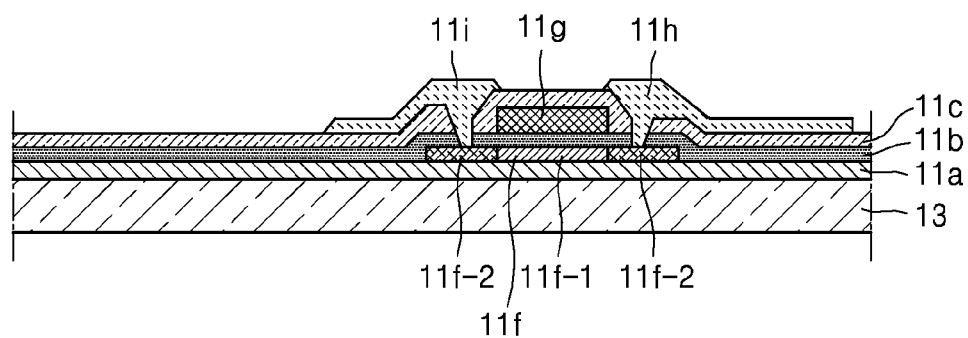
Figure 2H:
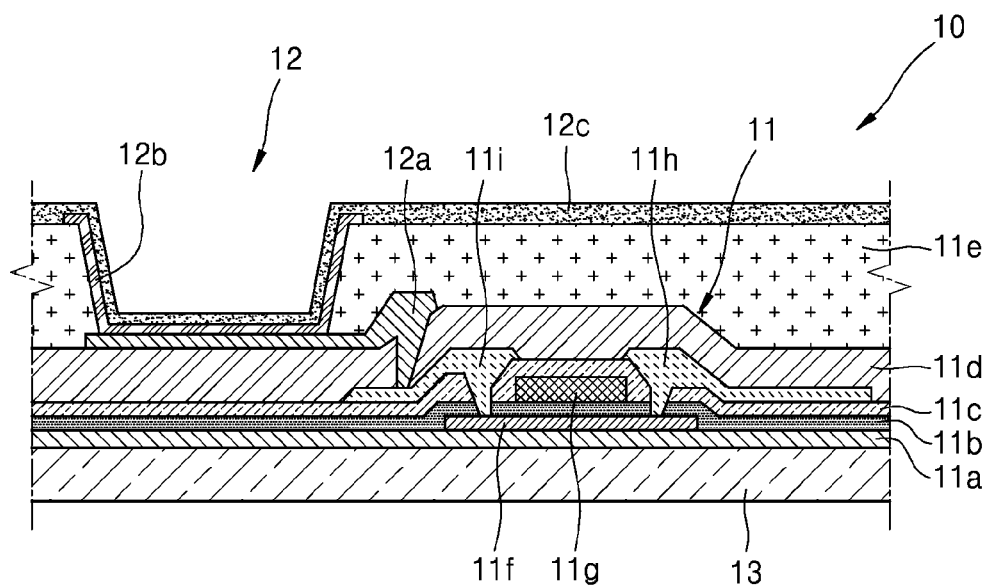

Next, as in FIG. 2G, the source electrode 11h and the drain electrode 11i are formed and connected to the contact portions 11f-2 of the active layer 11f. Then the basic structure of the thin film transistor 11 is completed, and the passivation film 11d, the pixel electrode 12a, the planarization film 11e, the organic emission layer 12b, the counter electrode 12c and the like are formed in order thereafter, which leads to complete the EL device 12 connected to the thin film transistor 11 as in FIG. 2H.

If the thin film transistor 11 and the OLED display 10 are manufactured with such a process, the manufacturing process is simplified because the doping for improving the threshold voltage property of the active layer 11f and the annealing may be progressed substantially simultaneously, and thus productivity is improved.

Next, FIGS. 3A through 3G illustrate a process of manufacturing a thin film transistor 11 according to another embodiment. The present embodiment shows the manufacturing process where it is possible to make the process simpler than the previous embodiment and may be implemented as follows.

Figure 3A:
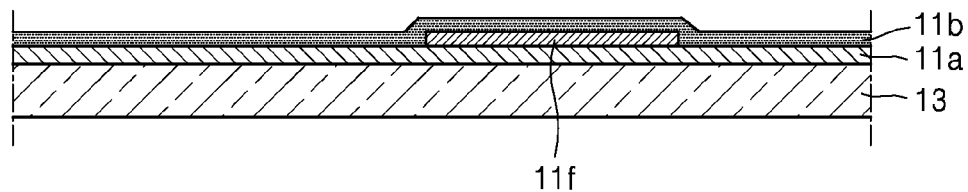
FIGS. 3A through 3G are cross-sectional views sequentially illustrating a manufacturing process of a thin film transistor according to another embodiment.

First, as in FIG. 3A, right after a buffer layer 11a is formed on a substrate 13 and a silicon active layer 11f is deposited on the buffer layer 11a and thus patterned, a SiOx gate insulating layer 11b is deposited thereon. That is, the active layer 11f continues to be in an amorphous state until the gate insulating layer 11b is formed. When the gate insulating layer 11b is deposited, as in the previous embodiment, a dopant is included in the gate insulating layer 11b by supplying a dopant gas as well.

Figure 3B:
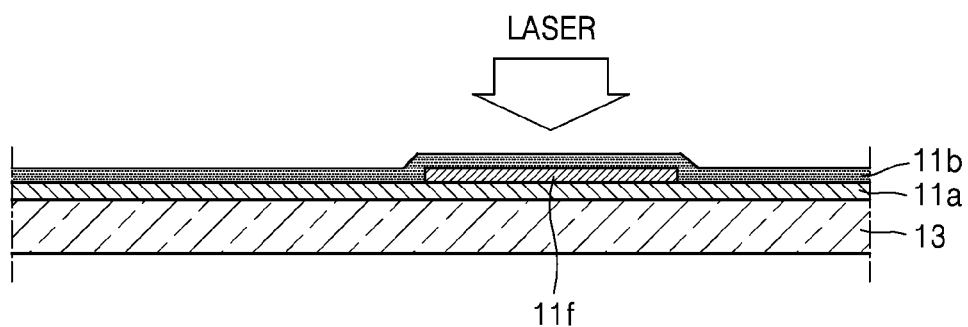

After the gate insulating layer 11b including the dopant has been formed as such, doping is made to take place as the dopant included in the gate insulating layer 11b is diffused into the active layer 11f by irradiating laser as in FIG. 3B. Then, as the dopant included in the gate insulating layer 11b is diffused into the active layer 11f, the doping takes place substantially uniformly in the whole region of the active layer 11f. Furthermore, the active layer 11f in the amorphous state becomes crystallized by the laser irradiation. That is, the crystallization and dopant doping of the active layer 11f take place substantially simultaneously. Also, because the doping makes progress as the active layer 11f is heated, annealing treatment for activating the dopant makes progress as well.

Figure 3C:
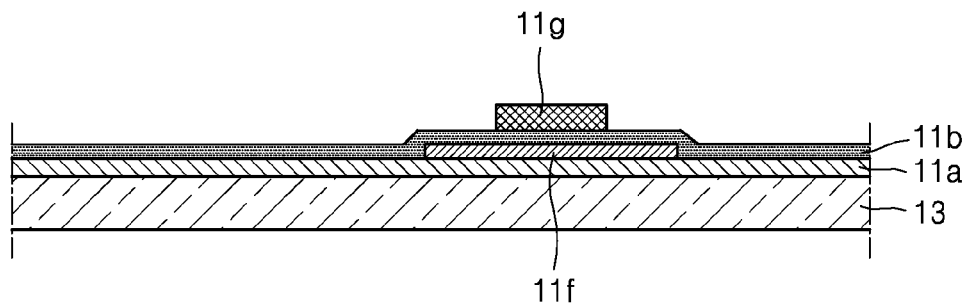

Referring to FIG. 3C, after the dopant doping by diffusion from the gate insulating layer 11b to the active layer 11f has been completed, a gate electrode 11g is formed.

Figure 3D:
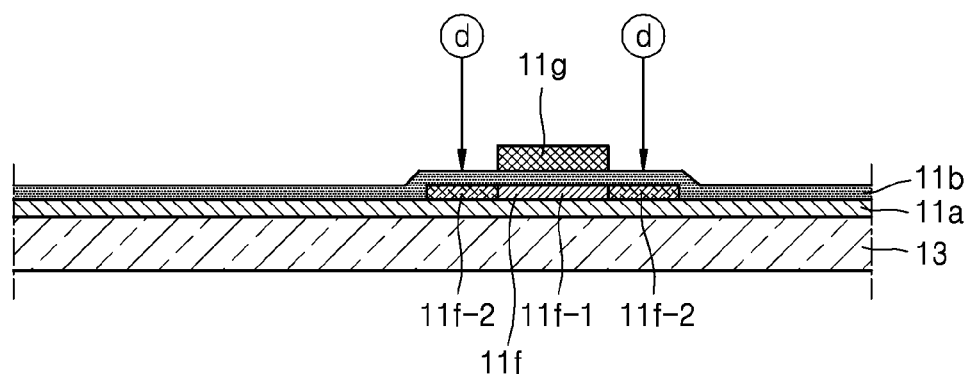

Referring to FIG. 3D, the dopant is ion implanted in contact portions 11f-2 of the active layer 11f. Here, the gate electrode 11g facing a channel portion 11f-1 works as a mask preventing the dopant from being doped into the channel portion 11f-1.

Figure 3E:
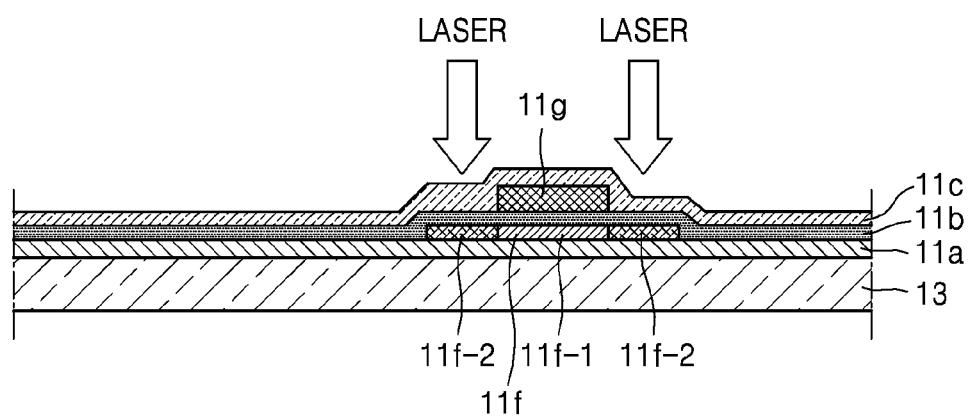

Next, as shown in FIG. 3E, after an interlayer insulating film 11c has been formed, the dopant additionally doped into the contact portions 11f-2 is electrically activated by irradiating laser for annealing. Then, the active layer 11f including the channel portion 11f-1 which has an improved threshold voltage property and the contact portions 11f-2 which have become conductive is obtained.

Figure 3F:
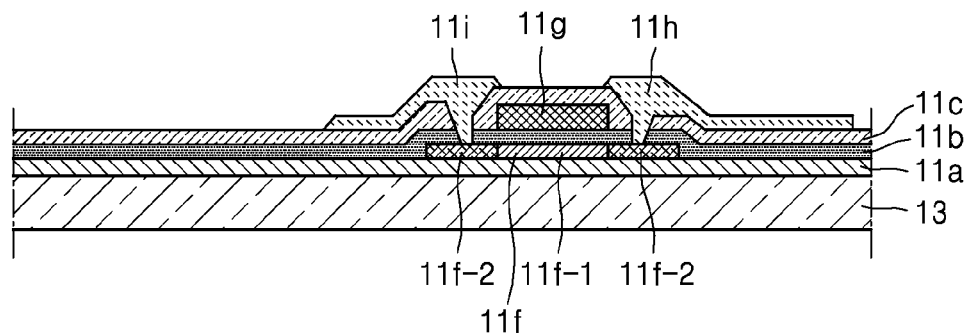

Referring to FIG. 3F, a source electrode 11h and a drain electrode 11i are formed and connected to the contact portions 11f-2 of the active layer 11f.

Figure 3G:
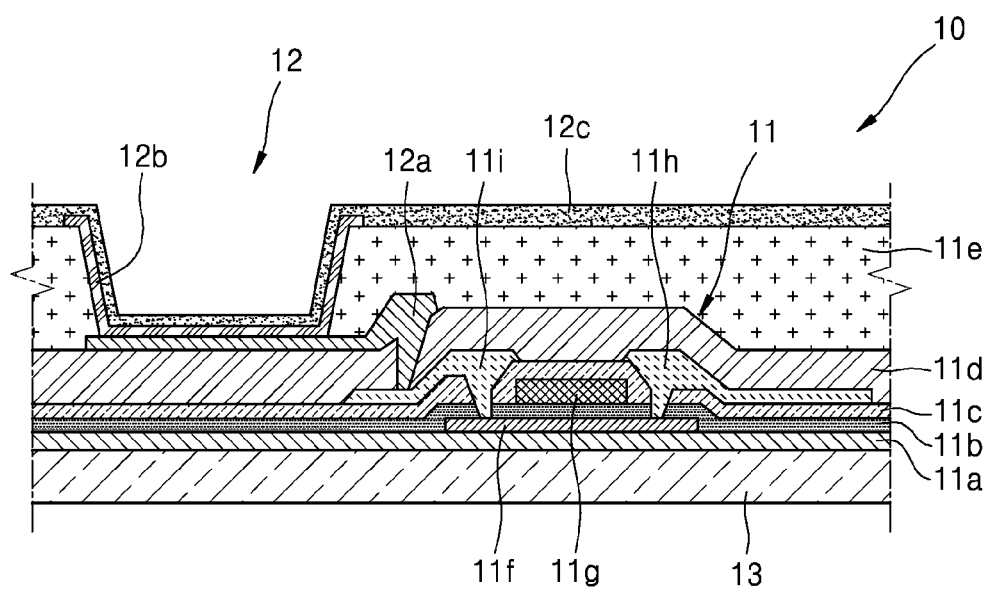

Referring to FIG. 3G, a passivation film 11d, a pixel electrode 12a, a planarization film 11e, an organic emission layer 12b, a counter electrode 12c, and the like are formed in order, which leads to complete an EL device 12 connected to the thin film transistor 11.

According to the present embodiment, the manufacturing process may be further simplified because the crystallization, doping, and annealing of the active layer 11f may be progressed simultaneously through the above process.

FIGS. 4A through 4E illustrate a process of manufacturing a thin film transistor 11 according to another embodiment. The present embodiment shows the manufacturing process where it is possible to make the process simpler than the previous embodiments and may be implemented as follows.

Figure 4A:
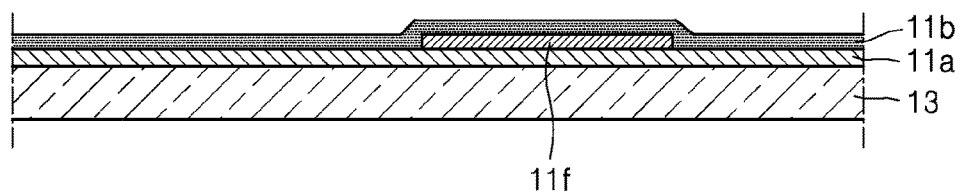
FIGS. 4A through 4E are cross-sectional views sequentially illustrating a manufacturing process of a thin film transistor according to another embodiment.

First, as in FIG. 4A, after a buffer layer 11a is formed on a substrate 13 and a silicon active layer 11f is deposited on the buffer layer 11a and thus patterned, a SiOx gate insulating layer 11b is deposited thereon. That is, the active layer 11f continues to be in an amorphous state until the gate insulating layer 11b is formed. When the gate insulating layer 11b is deposited, as in the previous embodiments, a dopant is included in the gate insulating layer 11b by supplying a dopant gas as well.

Figure 4B:
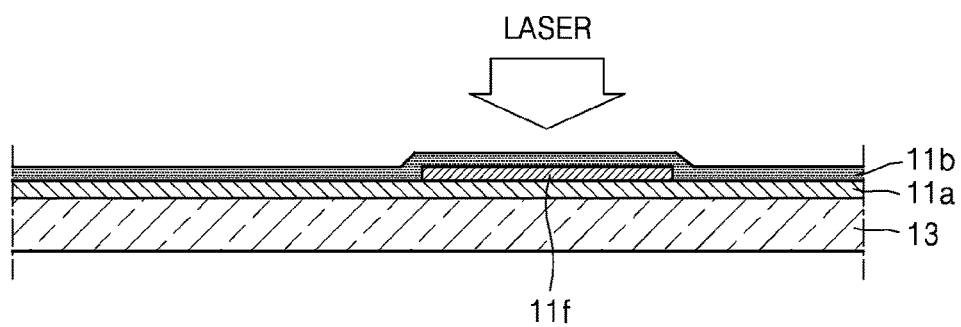

After the gate insulating layer 11b including the dopant has been formed as such, doping is made to take place as the dopant included in the gate insulating layer 11b is diffused into the active layer 11f by irradiating laser as in FIG. 4B. Then, as the dopant included in the gate insulating layer 11b is diffused into the active layer 11f, the doping takes place substantially uniformly in the whole region of the active layer 11f. Furthermore, the active layer 11f in the amorphous state becomes crystallized by the laser irradiation. That is, the crystallization and dopant doping of the active layer 11f take place substantially simultaneously. Also, because the doping makes progress as the active layer 11f is heated, annealing treatment for activating the dopant makes progress as well.

Figure 4C:
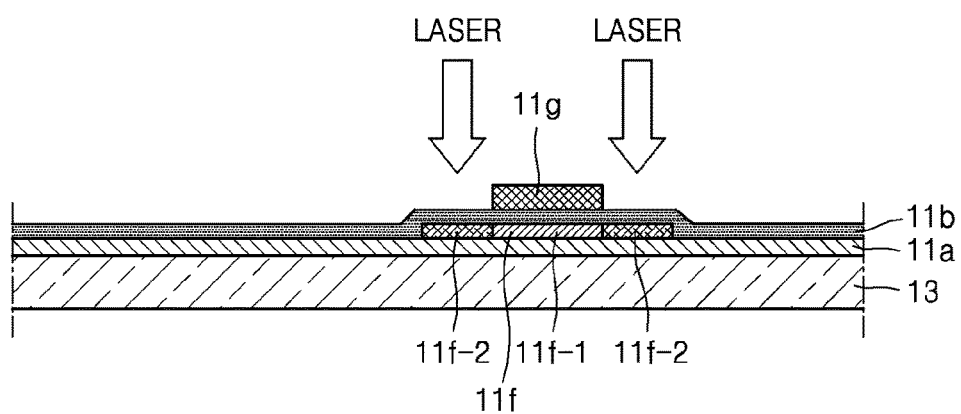

After the dopant doping by diffusion from the gate insulating layer 11b to the whole region of the active layer 11f has been completed, a gate electrode 11g is formed and laser is irradiated again with respect to contact portions 11f-2 of the active layer 11f as in FIG. 4C. Here, the gate electrode 11g facing a channel portion 11f-1 works as a mask preventing the laser from being irradiated toward the channel portion 11f-1. Then the dopant which remains in the gate insulating layer 11b is additionally doped by diffusion into the contact portions 11f-2. That is, the doping for making the contact portions 11f-2 conductive is not performed with an extra ion implantation process but progressed with a method of irradiating laser again with respect to the contact portions 11f-2. Then the doping of the contact portions 11f-2 is also progressed simultaneously with heating by laser irradiation, and therefore it is not needed to go through an additional activation operation later.

Figure 4D:
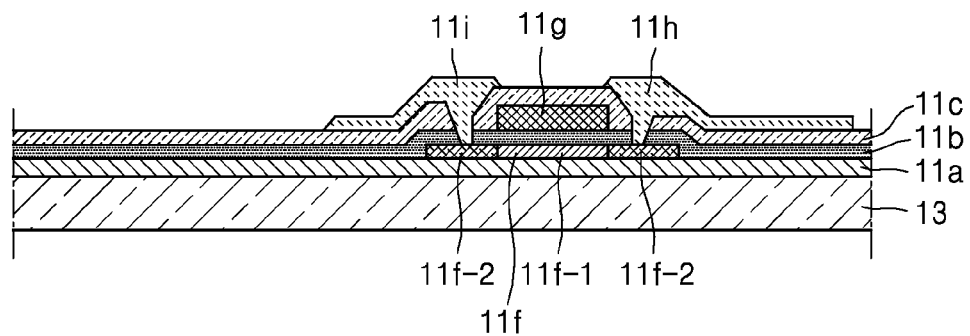

Next, as shown in FIG. 4D, after an interlayer insulating film 11c has been formed, a source electrode 11h and a drain electrode 11i are formed and connected to the contact portions 11f-2 of the active layer 11f.

Figure 4E:
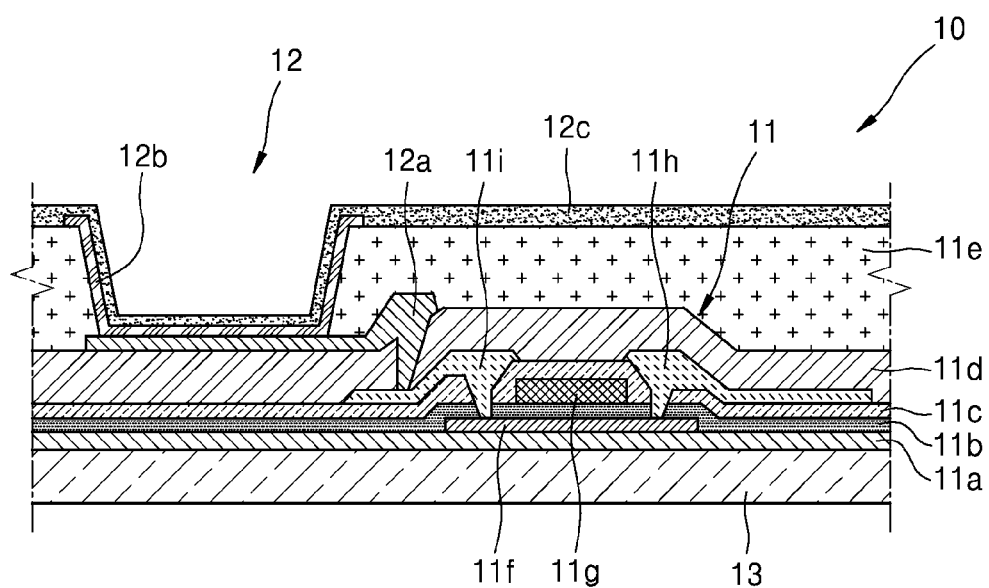

Referring to FIG. 4E, a passivation film 11d, a pixel electrode 12a, a planarization film 11e, an organic emission layer 12b, and a counter electrode 12c, and the like are formed in order, which leads to complete an EL device 12 connected to the thin film transistor 11 as in FIG. 4E.

According to the present embodiment, the manufacturing process may be further simplified because the manufacturing process having been progressed with separate processes such as the crystallization, doping, and annealing of the active layer 11f may be progressed at a time through the above process.

Figure 5A:
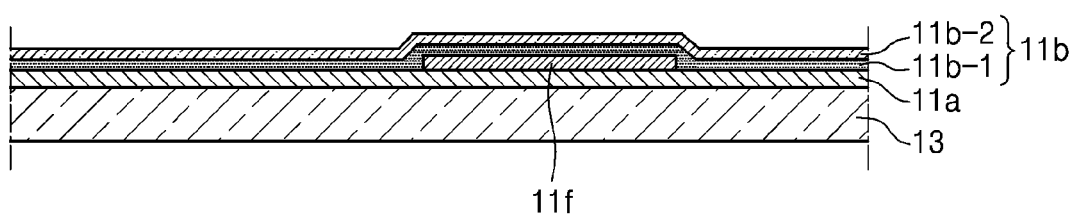
FIGS. 5A and 5B are cross-sectional views illustrating a transformable example of a gate insulating layer forming process of the method of manufacturing the thin film transistor according to embodiments.
Figure 5B:
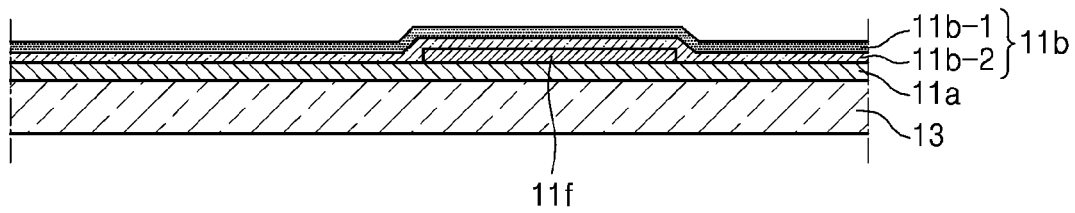

Meanwhile, while at least one of the disclosed embodiments illustrates cases where the gate insulating layer 11b are formed only with a layer containing the dopant, an auxiliary insulating layer containing no dopant 11b-2 may be formed adjoining an upper or lower portion of the gate insulating layer containing the dopant 11b-1 as shown in FIGS. 5A and 5B. Then a possibility that an insulating property of the gate insulating layer 11b may rather deteriorate depending on a dopant content may be covered.

According to at least one of the above embodiments, using the method of manufacturing the thin film transistor enables simplifying the doping process of the active layer, thus improving product productivity.

While the inventive technology has been described with reference to the figures, it will be understood by those of ordinary skill in the art that various changes in form and details may be made therein without departing from the spirit and scope of the present invention as defined by the following claims.

What is claimed is:

1. A method of manufacturing a thin film transistor, the method comprising:
   forming an active layer over a substrate;
   forming a gate insulating layer containing a dopant over the active layer;
   irradiating laser light onto the gate insulating layer such that the dopant of the gate insulating layer diffuses into the active layer;
   forming a gate electrode facing a channel portion in a center of the active layer over the gate insulating layer; and
   additionally doping a dopant into contact portions on both end sides of the channel portion while using the gate electrode as a mask.

2. The method of claim 1, wherein the forming of the active layer comprises:
   forming the active layer in an amorphous state over the substrate; and
   crystallizing the active layer from the amorphous state into a crystalline state.

3. The method of claim 1, wherein the dopant is substantially uniformly diffused into substantially an entire region of the active layer.

4. The method of claim 1, wherein the forming of the active layer comprises forming the active layer in an amorphous state over the substrate, and wherein the irradiating comprises crystallizing the active layer from the amorphous state into a crystalline state by the irradiating.

5. The method of claim 1, wherein the forming of the gate insulating layer comprises forming an auxiliary insulating layer containing no dopant in a layer adjoining the gate insulating layer.

6. The method of claim 1, wherein the additionally doping comprises ion implanting the dopant in the contact portions.

7. The method of claim 6, further comprising activating the additionally doped dopant by irradiating laser light with respect to the contact portions.

8. The method of claim 1, wherein the additionally doping comprises irradiating laser light onto the contact portions such that the dopant of the gate insulating layer is doped by diffusion into the contact portions.

9. The method of claim 1, further comprising:
   forming an interlayer insulating film over the gate electrode; and forming a source electrode and a drain electrode connected to the contact portions on the interlayer insulating film.

10. The method of claim 1, wherein the active layer comprises a channel portion in a center of the active layer and contact portions on both end sides of the channel portion, and wherein the dopant of the gate insulating layer substantially uniformly diffuses into the channel portion and the contact portions by the irradiating.

11. A method of manufacturing a display device, the method comprising:
forming a thin film transistor over a substrate; and
forming a pixel electrode to be electrically connected to the thin film transistor,
wherein the forming of the thin film transistor comprises:
forming an active layer over the substrate;
forming a gate insulating layer containing a dopant over the active layer;
irradiating laser light onto the gate insulating layer such that the dopant of the gate insulating layer diffuses into the active layer;
forming a gate electrode facing a channel portion in a center of the active layer over the gate insulating layer; and
additionally doping a dopant into contact portions on both end sides of the channel portion while using the gate electrode as a mask.

12. The method of claim 11, further comprising forming an organic light-emitting layer on the pixel electrode.

13. The method of claim 12, wherein the organic light-emitting layer does not overlap the active layer.

14. The method of claim 11, wherein the forming of the active layer comprises:
forming the active layer in an amorphous state over the substrate; and
crystallizing the active layer from the amorphous state into a crystalline state.

15. The method of claim 11, wherein the dopant is substantially uniformly diffused into substantially an entire region of the active layer.

16. The method of claim 11, wherein the forming of the active layer comprises forming the active layer in an amorphous state over the substrate, and wherein the irradiating comprises crystallizing the active layer from the amorphous state into a crystalline state by the irradiating.

17. The method of claim 11, wherein the forming of the gate insulating layer comprises forming an auxiliary insulating layer containing no dopant in a layer adjoining the gate insulating layer.

18. The method of claim 11, wherein the additionally doping comprises irradiating laser light onto the contact portions such that the dopant of the gate insulating layer is doped by diffusion into the contact portions.

* * * * *